(12) United States Patent
Kuczynski et al.

(10) Patent No.: US 10,982,060 B2
(45) Date of Patent: Apr. 20, 2021

(54) GLASS-FREE DIELECTRIC LAYERS FOR PRINTED CIRCUIT BOARDS

(71) Applicant: International Business Machines Corporation, Armonk, NY (US)

(72) Inventors: Joseph Kuczynski, North Port, FL (US); Jason T. Wertz, Pleasant Valley, NY (US); Bruce J. Chamberlin, Vestal, NY (US); Sarah K. Czaplewski-Campbell, Rochester, MN (US); Jing Zhang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 15/895,659

(22) Filed: Feb. 13, 2018

(65) Prior Publication Data
US 2019/0248970 A1 Aug. 15, 2019

(51) Int. Cl.
  *B32B 3/24* (2006.01)
  *C08J 5/18* (2006.01)
  *B29C 39/00* (2006.01)
  *B29C 45/14* (2006.01)
  *B26F 1/02* (2006.01)
  (Continued)

(52) U.S. Cl.
  CPC ............... *C08J 5/18* (2013.01); *B26F 1/02* (2013.01); *B26F 1/16* (2013.01); *B26F 1/31* (2013.01); *B29C 39/003* (2013.01); *B29C 45/14819* (2013.01); *B32B 5/00* (2013.01); *H05K 1/024* (2013.01); *H05K 1/0298* (2013.01); *B29K 2039/00* (2013.01); *B32B 3/266* (2013.01); *C08J 2379/04* (2013.01); *H05K 2201/0175* (2013.01); *H05K 2201/091* (2013.01); *Y10T 428/24347* (2015.01)

(58) Field of Classification Search
  CPC ..................................................... B32B 3/266
  See application file for complete search history.

(56) References Cited

U.S. PATENT DOCUMENTS 5,137,985 A   8/1992  Chen, Sr. et al.
5,902,876 A * 5/1999  Murata .................. C08G 73/18
                                                    528/125
(Continued)

OTHER PUBLICATIONS

PBI Performance Products, Inc., *Celazole® T-Series: Injection Molding Thermoplastic Polymers*, Brochure, accessed Nov. 8, 2017, PBI Performance Products, Inc., (online), <http://pbipolymer.com/wp-content/uploads/2016/05/T-series-brochure-updated.pdf>, 6 pages.
(Continued)

*Primary Examiner* — William P Watkins, III
(74) *Attorney, Agent, or Firm* — Mark Bergner

(57) ABSTRACT

According to one aspect, a glass-free pre-impregnated material includes a polybenzimidazole (PBI) sheet and a partially cured resin encapsulating the PBI sheet. According to another aspect, a process of forming a glass-free pre-impregnated material includes encapsulating a PBI sheet within a resin and partially curing the resin to form the glass-free pre-impregnated material. According to yet another aspect, a printed circuit board comprises a glass-free dielectric layer that includes a PBI sheet encapsulated within a cured resin.

18 Claims, 5 Drawing Sheets

(51) Int. Cl.
*B26F 1/16* (2006.01)
*H05K 1/02* (2006.01)
*B26F 1/31* (2006.01)
*B32B 5/00* (2006.01)
*B32B 3/26* (2006.01)

(56) References Cited

U.S. PATENT DOCUMENTS

| | | |
|---|---|---|
| 7,282,257 B2 | 10/2007 | Orikabe et al. |
| 7,754,803 B2 | 7/2010 | Fujiwara et al. |
| 7,887,887 B2 | 2/2011 | Cho et al. |
| 8,294,040 B2 | 10/2012 | Shimizu et al. |
| 2003/0181560 A1 | 9/2003 | Kawaguchi et al. |
| 2010/0134991 A1* | 6/2010 | Kim .................. H05K 1/185 361/762 |
| 2014/0235424 A1 | 8/2014 | Li |
| 2015/0027757 A1 | 1/2015 | Shin et al. |
| 2015/0289368 A1 | 10/2015 | Daghighian et al. |

OTHER PUBLICATIONS

Plastics International, *Celazole® PBI (Polybenzimidazole)*, Datasheet, accessed Nov. 8, 2017, Plastics International (online) <http://www.plasticsintl.com/datasheets/Celazole_PBI.pdf>, 1 page.

* cited by examiner

GLASS-FREE DIELECTRIC LAYERS FOR PRINTED CIRCUIT BOARDS

BACKGROUND

Woven glass cloth is used in a variety of applications. For example, woven glass cloth may be used in the production of printed circuit boards. Glass cloth relies on weaving for mechanical strength. A woven glass cloth includes "warp" glass fiber yarns arranged in a first direction (e.g., vertical) and "weft" glass fiber yarns arranged in a second (e.g., horizontal) direction. In a plain weave pattern, each warp glass fiber yarn passes alternately over and under each weft glass fiber yarn. The regions of a woven glass cloth where multiple fibers are present (e.g., with one fiber passing over the other fiber) is called a "knuckle." Woven fabrics may further include "weaving windows" (e.g., gaps) between fibers through which fibers are interwoven. Thus, a woven glass cloth may include areas that have one glass bundle or two glass bundles and may further include gaps where no glass bundles are present.

During the fabrication of printed circuit boards, woven glass bundles (e.g., woven bundles of "E-glass" fibers) are used to provide mechanical stability and ease of handling. Unfortunately, E-glass has a relatively high dielectric constant, which contributes to signal degradation. Moreover, as a high-speed signal traverses the glass knuckles of the woven glass cloth, signal integrity is degraded due to the mismatch in dielectric constant. Additionally, the glass knuckles may cause mechanical interference with the adjacent copper planes that may result in compromised reliability. Consequently, it is desirable to eliminate woven glass cloth in the fabrication of printed circuit boards. However, there are challenges associated with finding a material that is a suitable replacement for a woven glass cloth of E-glass fibers. Thus, there is a need for an alternative to a woven glass cloth in printed circuit boards.

SUMMARY

According to one embodiment, a glass-free pre-impregnated material includes a polybenzimidazole (PBI) sheet and a partially cured resin encapsulating the PBI sheet.

According to another embodiment, a process of forming a glass-free pre-impregnated material includes encapsulating a PBI sheet within a resin and partially curing the resin to form the glass-free pre-impregnated material.

According to yet another embodiment, a printed circuit board includes a glass-free dielectric layer. The glass-free dielectric layer includes a PBI sheet encapsulated within a cured resin.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

The present disclosure describes glass-free dielectric layers for printed circuit boards and methods of utilizing polybenzimidazole (PBI) sheets to form the glass-free dielectric layers. As used herein, the term PBI refers to a poly[2,2'-(m-phenylen)-5,5'-bisbenzimidazole] material. In the present disclosure, a PBI sheet (e.g., a perforated PBI sheet or a PBI sheet that has been surface treated to promote resin adhesion) is utilized as a low-loss mechanical support for a resin and may serve as a "drop-in" replacement for a woven glass cloth when forming a dielectric layer of a printed circuit board. In embodiments where the PBI sheet includes perforations to promote adhesion of resin to the PBI sheet, various processes may be utilized to form the perforated PBI sheet. Subsequently, the PBI sheet (e.g., the perforated PBI sheet) may be impregnated with a resin, and the resin may be partially cured ("B-staged") to form a glass-free pre-impregnated (prepreg) material. The glass-free prepreg material may replace a conventional prepreg material that includes a woven glass cloth in order to form a glass-free dielectric layer of a printed circuit board.

Figure 1:
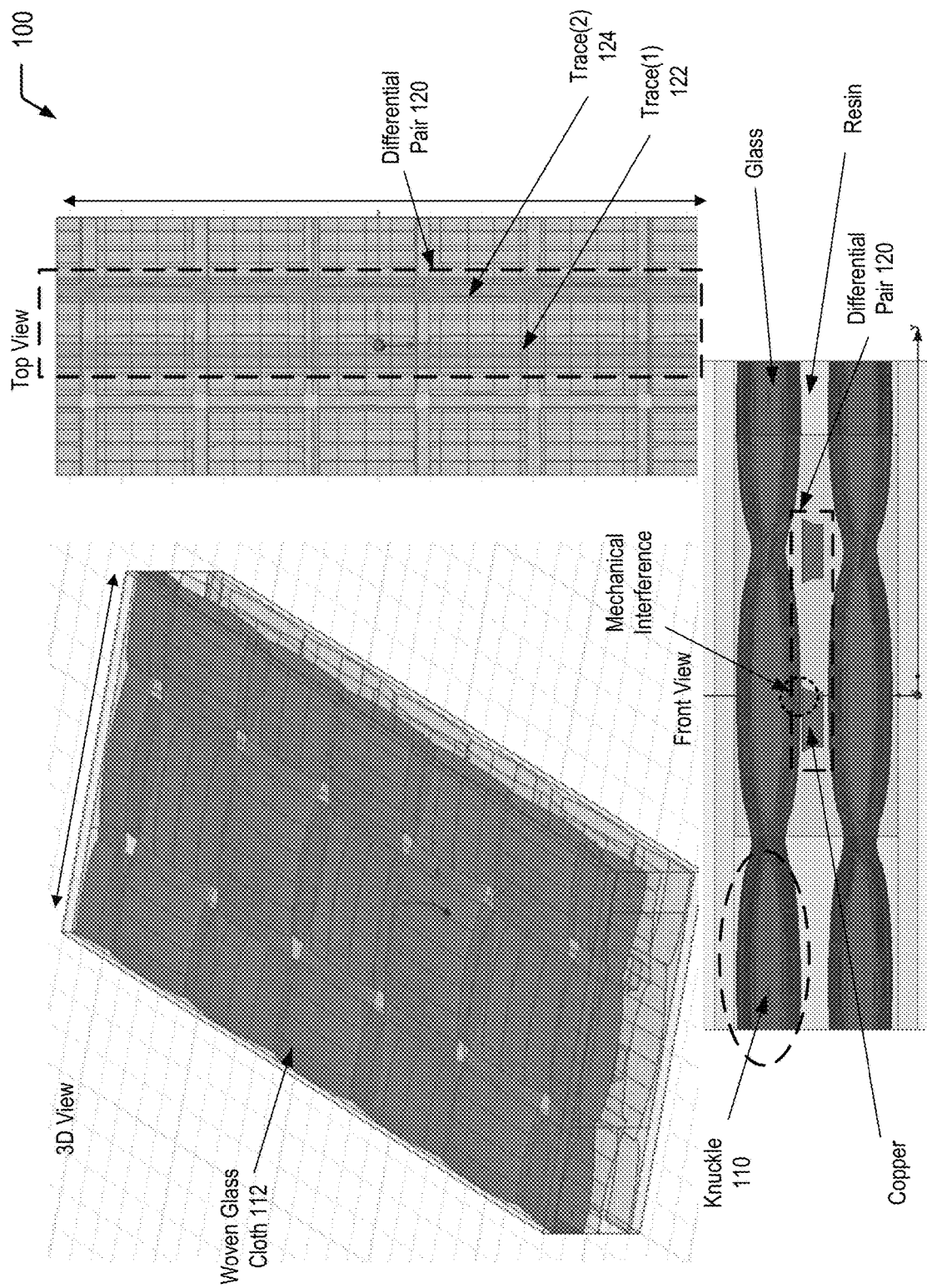
FIG. 1 is a prior art figure that illustrates a conventional woven glass cloth that may be utilized to form a dielectric layer of a printed circuit board.

Referring to FIG. 1, a prior art diagram 100 illustrates multiple views of selected portions of a printed circuit board that includes dielectric layers formed from conventional woven glass cloths. In FIG. 1, a three-dimensional (3D) view is depicted at the top left, a top view is depicted at the top right, and a front view is depicted at the bottom.

The various views depicted in FIG. 1 illustrate that a knuckle 110 in a conventional woven glass cloth 112 corresponds to a region where weft glass fibers transition from passing to one side to passing to another side of warp glass fibers. The 3D and front views illustrate the non-uniform thickness of the woven glass cloth 112, ranging approximately from the thickness of an individual glass bundle to the thickness of two glass bundles where the knuckles are located (e.g., as shown in the front view for the representative knuckle 110). The front view further illustrates that the glass knuckles may cause mechanical interference (represented by dashed lines) with the adjacent copper planes. The front view and the top view illustrate an example of a differential pair 120, including a first trace 122 and a second trace 124, and the locations of the traces 122, 124 disposed beneath the dielectric layer formed from the woven glass cloth 112.

FIG. 1 illustrates that the woven glass cloth 112 may be used to reinforce a non-conductive substrate to which copper traces are bonded in printed circuit boards. The variation in number of glass fibers present across the surface may cause the woven glass cloth 112 to have varying dielectric constants across the surface. Accordingly, signals routed along a conductive trace bonded to the woven glass cloth 112 may degrade. Further, timing of signals routed along traces (e.g., the first trace 122 and the second trace 124) that traverse different portions of the woven glass cloth 112 may be skewed differently based on the varied topography of the woven glass cloth 112 (e.g., because the dielectric constants of different portions of the glass cloth may be different). The varied timing may negatively impact performance of electronic devices.

FIG. 1 illustrates that in the woven glass cloth 112, glass weaves are bound together, surrounded and impregnated by resin. Electrical properties, particularly the dielectric constant ($\varepsilon_r$) of these materials are different. Hence, there is variation of the effective dielectric constant ($\varepsilon_{eff}$) in the PCB laminate structure. The variation of the effective dielectric constant leads to variations of impedance of the strip-lines in addition to different propagation delays on the nets of differential pairs (e.g., the differential pair 120 depicted in the front view and top view) if they are consistently routed within different effective dielectric constant regions. The effective dielectric constant is a function of the dielectric constant of the glass ($\varepsilon_{glass}$) the dielectric constant of the resin ($\varepsilon_{resin}$), and the percentage volume of glass and resin in the laminate layers which comprise the printed circuit board. Ultimately, this leads to skew in differential pairs and data transmission errors. Additionally, impedance variations along a stripline can lead to unwanted reflections lowering amplitude. These variations depend on the weave structure, the position of traces with respect to weaves, trace dimensions, etc., and are thus difficult to control.

A high-speed bus is a communication channel that interconnects central processing units (CPUs) to other computer systems, storage systems, network switches or other peripherals. The physical implementation of a high-speed bus presents many design choices driven by technologies, cost, and reliability, among other factors. Such choices include printed circuit board designs (e.g., thickness, number of layers, and material properties), differential or single ended wiring, wiring density clearance/spacing from noise sources, types of connectors to use, via type and properties, among other choices. Requirements for high-speed bus communication include high throughput and low latency and the maintenance of signal integrity, among others. Challenges include maintaining signal amplitude and shape, minimizing dispersion, and minimizing the phase offset between traces within differential pairs, among others.

A particular challenge in high-speed bus communications is the differential-pair stripline, which represents the basic unit structure for a transmission line/interconnect. In the differential-pair stripline, a signal flows through the coupled lines in a differential mode for noise cancellation, among other benefits. One challenge associated with the differential-pair stripline is maintaining uniform stripline impedance throughout the length of the pair. When the propagation velocity differs in the traces which compromise a differential pair, there is a difference in delay between the two traces, also referred to as skew. These differences result in a degradation in the quality of the signal at the point where it is received. While there are numerous factors that contribute to skew, inhomogeneities in the dielectric material of a printed circuit board laminate structure represents one cause of skew.

Thus, FIG. 1 illustrates various shortcomings of a conventional woven glass cloth that is utilized to form a dielectric layer of printed circuit board. The E-glass fibers have a relatively high dielectric constant, which contributes to signal degradation. Moreover, as a high-speed signal traverses the glass knuckles of the woven glass cloth, signal integrity is degraded due to the mismatch in dielectric constant. Additionally, the glass knuckles may cause mechanical interference with the adjacent copper planes that may result in compromised reliability.

Figure 2:
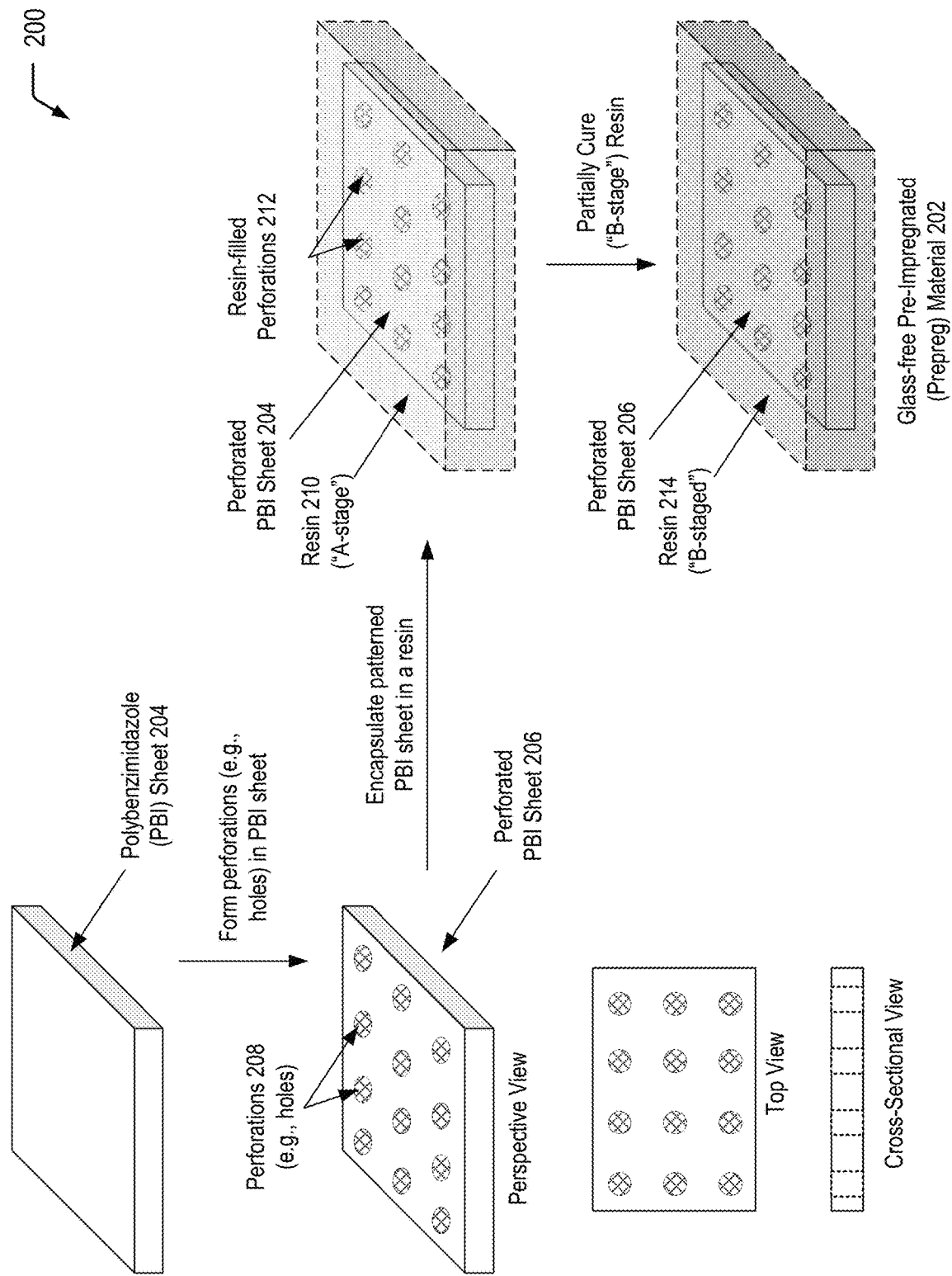
FIG. 2 illustrates a process of forming a glass-free pre-impregnated (prepreg) material by encapsulating a polybenzimidazole (PBI) sheet (e.g., a perforated PBI sheet) within a resin and partially curing the resin, according to one embodiment.

Referring to FIG. 2, a diagram 200 illustrates an example of a process of forming a glass-free prepreg material 202, according to one embodiment. During fabrication of a printed circuit board, the glass-free prepreg material 202 depicted at the bottom right of FIG. 2 may replace a prepreg material that includes the conventional woven glass cloth 112 of FIG. 1. Forming a dielectric layer of a printed circuit board from the glass-free prepreg material 202 of FIG. 2 may mitigate the problems associated with the conventional woven glass cloth 112 of FIG. 1.

In some embodiments of the present disclosure, the PBI sheets include perforated PBI sheets to promote resin adhesion. In other embodiments, a surface treatment of a PBI sheet (e.g., mechanical roughening or a chemical surface treatment) may be adequate to provide satisfactory adhesion of a resin to the PBI sheet. In the particular embodiment depicted in FIG. 2, a polybenzimidazole (PBI) sheet 204 is the starting material for forming a perforated PBI sheet 206 that includes multiple perforations 208. For example, the perforations 208 may be formed by mechanical drilling, laser drilling, or punching. Alternatively, while not shown in the example of FIG. 2, polybenzimidazole may be injection molded or solution cast from DMSO (dimethyl sulfoxide) to form the perforated PBI sheet 206. In a particular embodiment, the PBI sheet 204 may have a thickness value that is substantially the same as or less than a conventional woven glass cloth, such as the woven glass cloth 112 depicted in FIG. 1. A conventional woven glass cloth may have a thickness in a range of about 0.03 mm to about 0.173 mm. As such, in some embodiments, the PBI sheet 204 of FIG. 2 may have a thickness that is not greater than about 0.03 mm, such as in a range of about 0.015 mm to about 0.03 mm.

The perforated PBI sheet 206 is illustrated in a perspective view, a top view, and a cross-sectional view. In the particular embodiment depicted in FIG. 2, the cross-sectional view illustrates that the perforations 208 depicted in the perspective view and top view correspond to holes through the PBI sheet 204. In other embodiments, the perforations 208 may represent "dimples" that extend to a particular depth from one surface of the PBI sheet 204 without reaching an opposite surface of the PBI sheet 204. For example, in some cases, the perforations 208 may include a set of perforations that extend from a top surface of the PBI sheet 204 without reaching a bottom surface of the PBI sheet 204. Alternatively or additionally, the perforations 208 may include a second set of perforations that extend from the bottom surface of the PBI sheet 204 without reaching the top surface of the PBI sheet 204. In some cases, in order to improve resin-to-PBI adhesion, the surface of the PBI sheet 204 may be roughened (mechanically or chemically) in order to improve adhesion.

FIG. 2 illustrates that the perforated PBI sheet 206 may be impregnated within a resin 210 (an "A-stage" resin) that fills the perforations 208 to form resin-filled perforations 212 and encapsulates the perforated PBI sheet 206. The resin 210 is then partially cured ("B-staged") to form the glass-free prepreg material 202 that includes a partially cured ("B-staged") resin 214. As illustrated and further described herein with respect to FIG. 3, the glass-free prepreg material 202 of FIG. 2 may be utilized to form a glass-free dielectric layer of a printed circuit board.

In contrast to the conventional woven glass cloth 112 depicted in the prior art diagram 100 of FIG. 1, the perforated PBI sheet 206 of FIG. 2 has a substantially uniform thickness. Therefore, the perforated PBI sheet 206 may have a more uniform dielectric constant than the conventional woven glass cloth 112 of FIG. 1. Since the topography of the perforated PBI sheet 206 may be more uniform (e.g., flatter and/or smoother) than woven glass cloths, signals routed along traces bonded to the perforated PBI sheet 206 (e.g., via conductive traces) may experience less timing skew (e.g., because the dielectric constant across the patterned PBI sheet 206 may be more uniform).

Similar to the woven glass cloth 112 of FIG. 1, the perforated PBI sheet 206 of FIG. 2 provides mechanical stability and ease of handling. The perforated PBI sheet 206 has a relatively low dielectric constant compared to the dielectric constant of E-glass fibers utilized to form the woven glass cloth 112 of FIG. 1, thereby mitigating signal degradation associated with the high dielectric constant of E-glass. Further, as the perforated PBI sheet 206 is not a weave structure like the woven glass cloth 112 of FIG. 1, there are no glass knuckles that are associated with signal integrity issues and mechanical interference with adjacent copper planes that may result in compromised reliability.

Thus, FIG. 2 illustrates an example of a process of forming a glass-free prepreg material by impregnating a perforated PBI sheet with a resin and partially curing ("B-staging") the resin. As illustrated and further described herein with respect to FIG. 3, the glass-free prepreg material may be utilized to form a glass-free dielectric layer of a printed circuit board.

Figure 3:
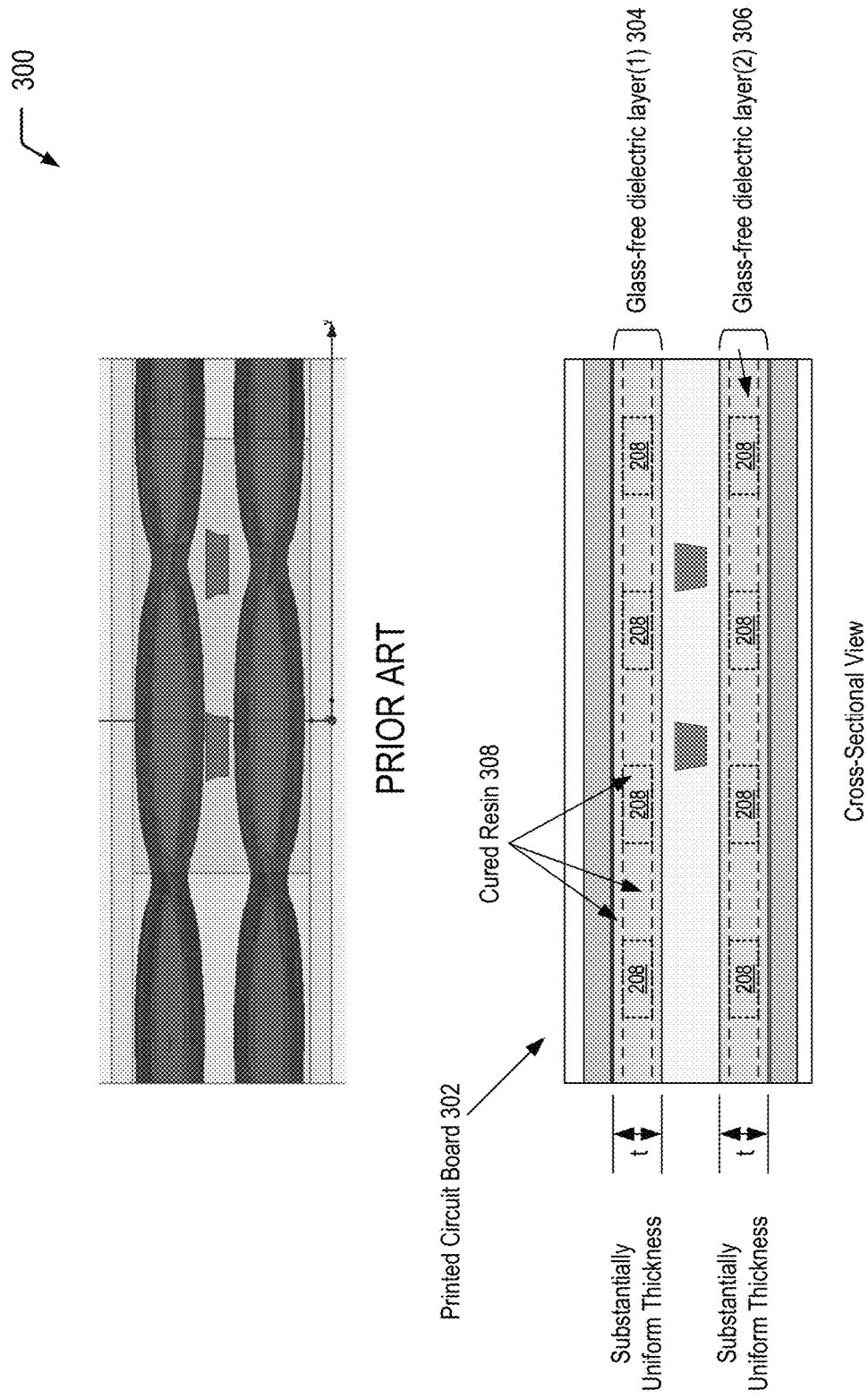
FIG. 3 illustrates selected portions of a printed circuit board having a glass-free dielectric layer that includes a PBI sheet (e.g., a perforated PBI sheet) encapsulated within a cured resin, according to one embodiment.

Referring to FIG. 3, a diagram 300 illustrates selected portions of a printed circuit board 302 that includes one or more glass-free dielectric layers formed from the glass-free prepreg material 202 of FIG. 2, according to one embodiment. In FIG. 3, the front view of the printed circuit board of FIG. 1 is depicted at the top of FIG. 3 for purposes of comparison to the printed circuit board 302 depicted at the bottom of FIG. 3.

The printed circuit board 302 depicted in FIG. 3 includes a first glass-free dielectric layer 304 and a second glass-free dielectric layer 306. FIG. 3 illustrates that each of the glass-free dielectric layers 304, 306 includes the perforated PBI sheet 206 depicted in FIG. 2. FIG. 3 further illustrates that each of the glass-free dielectric layers 304, 306 is encapsulated within a cured resin 308.

In contrast to the conventional woven glass cloth 112 of FIG. 1, each of the glass-free dielectric layers 304, 306 has a substantially uniform thickness without glass knuckles, thereby mitigating signal integrity issues and mechanical interference with adjacent copper planes that may result in compromised reliability.

Figure 4:
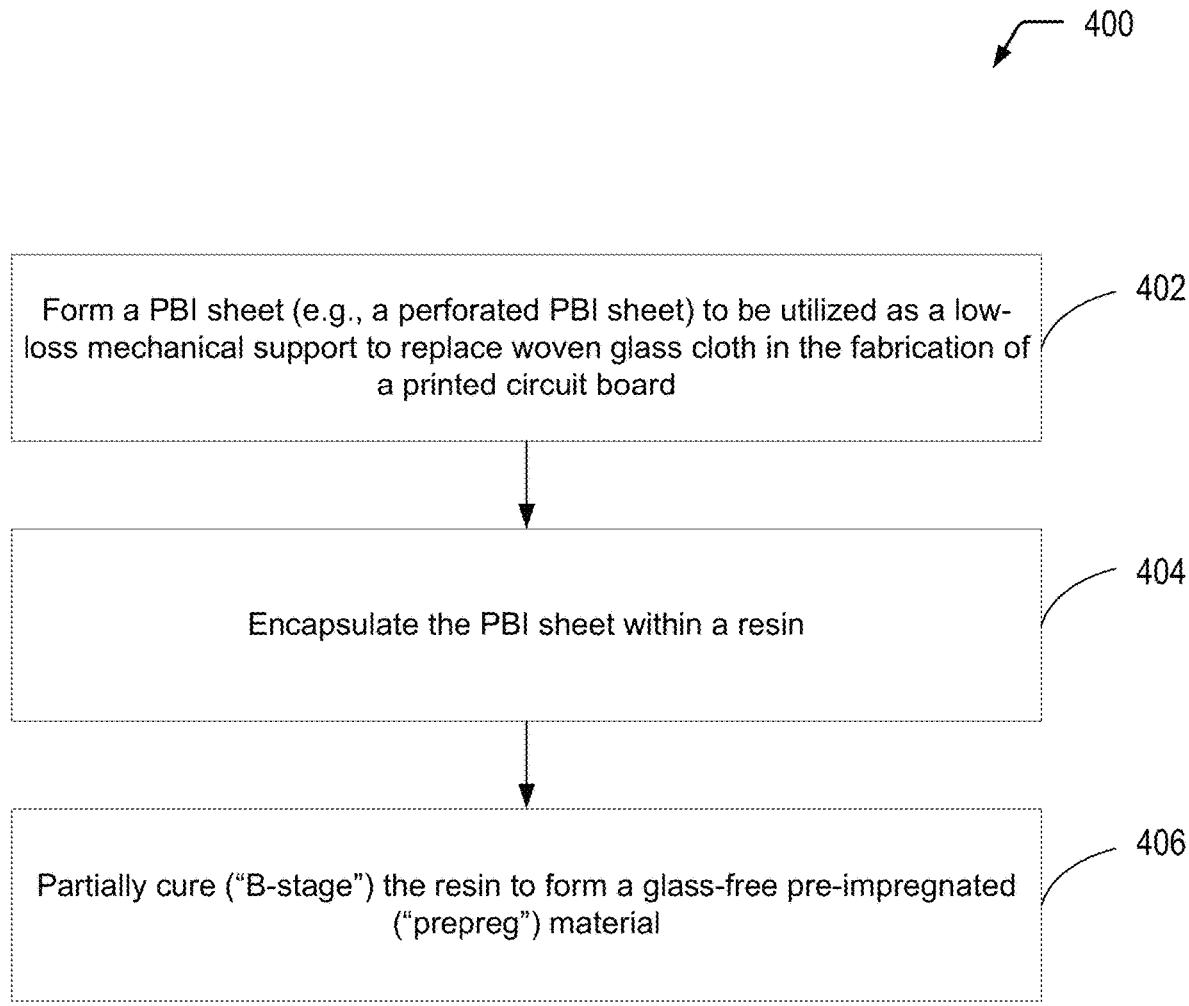
FIG. 4 is a flow diagram illustrating an example of a process of forming a glass-free prepreg material by encapsulating a PBI sheet (e.g., a perforated PBI sheet) within a resin and partially curing the resin, according to one embodiment.

FIG. 4 is a flow diagram of an example of a process 400 of forming a glass-free prepreg material, according to one embodiment. In the particular embodiment depicted in FIG. 4, the process 400 includes forming a perforated PBI sheet in order to improve resin adhesion. In other embodiments, a non-perforated PBI sheet, such as a surface-treated PBI sheet may provide adequate resin adhesion. It will be appreciated that the operations shown in FIG. 4 are for illustrative purposes only and that the operations may be performed in alternative orders, at alternative times, by a single entity or by multiple entities, or a combination thereof. As an example, one entity may form the patterned PBI sheet, while the same entity or a different entity may form the pre-impregnated PBI sheet by impregnating the patterned PBI sheet with resin and partially curing ("B-staging") the resin. As another example, a printed circuit board manufacturer may manufacture the printed circuit board from a multiple-layer PCB laminate structure ("layup") that includes the pre-impregnated PBI sheets of the present disclosure, resulting in curing of the resin in the pre-impregnated PBI sheets to form glass-free dielectric layers. The PBI sheets of the present disclosure provide mechanical stability without the signal degradation, signal integrity loss, and/or mechanical interference issues associated with dielectric layers formed from a conventional prepreg material that includes a woven glass cloth.

The process 400 includes forming a perforated PBI sheet, at 402. The perforated PBI sheet is to be utilized as a low-loss mechanical support to replace woven glass cloth in the fabrication of a printed circuit board. For example, referring to FIG. 2, the perforated PBI sheet 206 depicted on the left side of FIG. 2 may be formed from the PBI sheet 204. For example, the perforations 208 may be formed by mechanical drilling, laser drilling, or punching. Alternatively, while not shown in the example of FIG. 2, polybenzimidazole may be injection molded or solution cast from DMSO (dimethyl sulfoxide) to form the perforated PBI sheet 206. In the particular embodiment depicted in FIG. 2, the perforations 208 correspond to holes through the PBI sheet 204. In other embodiments, the perforations 208 may represent "dimples" that extend to a particular depth from one surface of the PBI sheet 204 without reaching an opposite surface of the PBI sheet 204.

The process 400 includes impregnating the patterned PBI sheet with resin, at 404. For example, referring to FIG. 2, the perforated PBI sheet 206 depicted on the left side of FIG. 2 may be impregnated with the resin 210 (an "A-stage" resin). The right side of FIG. 2 illustrates that the resin 210 fills the perforations 208 to form the resin-filled perforations 212 and encapsulates the perforated PBI sheet 206.

The process 400 includes partially curing ("B-staging") the resin to form a glass-free prepreg material, at 406. For example, referring to FIG. 2, the right side of FIG. 2 illustrates that the resin 210 is then partially cured ("B-staged") to form the glass-free prepreg material 202 that includes a partially cured ("B-staged") resin 214.

Thus, FIG. 4 illustrates an example of a process of forming a glass-free prepreg material to be utilized as a low-loss mechanical support to replace woven glass cloth in the fabrication of a printed circuit board.

Figure 5:
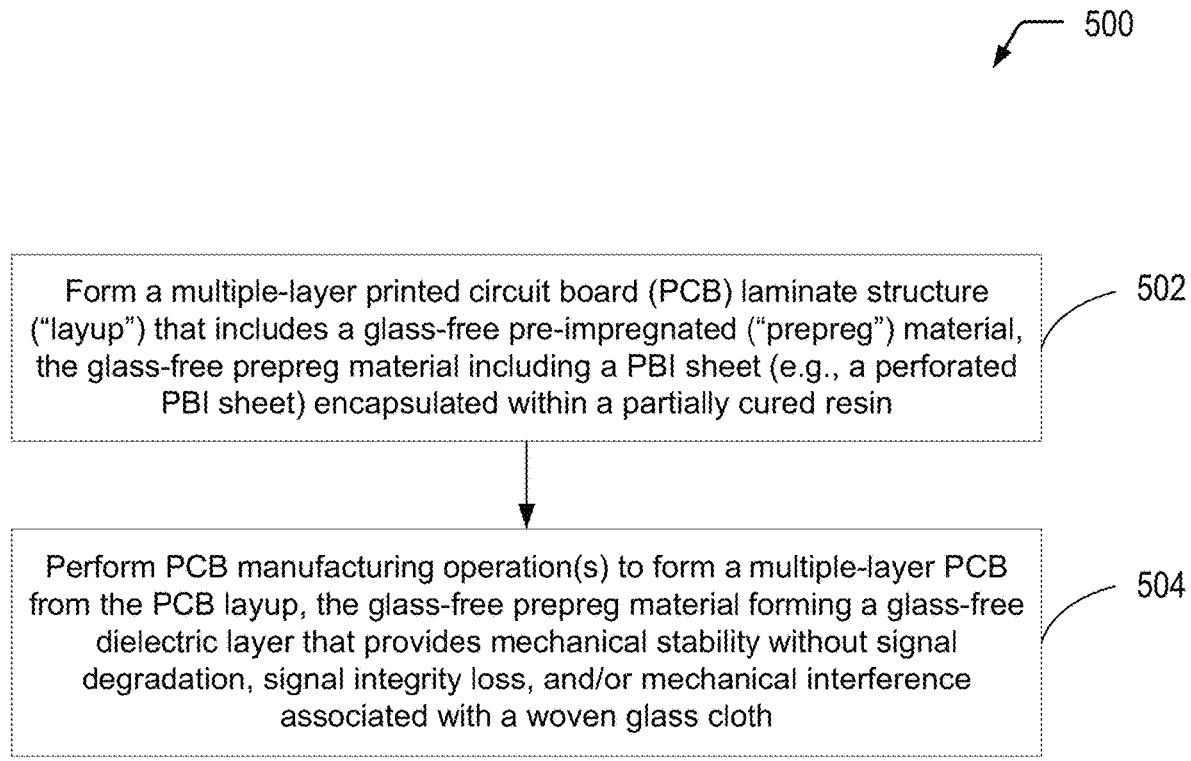
FIG. 5 is a flow diagram illustrating an example of a process of utilizing a glass-free prepreg material including a PBI sheet (e.g., a perforated PBI sheet) encapsulated within a partially cured resin to form a glass-free dielectric layer of a printed circuit board, according to one embodiment.

FIG. 5 is a flow diagram of an example of a process 500 of utilizing a glass-free prepreg material to form a glass-free dielectric layer of a printed circuit board, according to one embodiment. It will be appreciated that the operations shown in FIG. 5 are for illustrative purposes only and that the operations may be performed in alternative orders, at alternative times, by a single entity or by multiple entities, or a combination thereof.

The process 500 includes forming a multiple-layer PCB laminate structure ("layup") that includes a glass-free prepreg material, at 502. For example, multiple-layer PCB layup may include the glass-free prepreg material 202 depicted at the bottom right of FIG. 2.

The process 500 also includes performing PCB manufacturing operation(s) to form a multiple-layer PCB from the PCB layup, at 504. The glass-free prepreg material forms a glass-free dielectric layer that provides mechanical stability with signal degradation, signal integrity, and mechanical interference associated with a woven glass cloth. For example, referring to FIG. 3, each of the glass-free dielectric layers 304, 306 of the printed circuit board 302 may be formed from the glass-free prepreg material 202 of FIG. 2. In contrast to the printed circuit board of FIG. 1 formed from the conventional woven glass cloth 112 with the associated knuckles, FIG. 3 illustrates that each of the glass-free dielectric layers 304, 306 has a substantially uniform thickness.

Thus, FIG. 5 illustrates an example of a process of utilizing the glass-free prepreg material of the present disclosure as an alternative to a conventional prepreg material that includes a woven glass cloth. The glass-free prepreg material forms a glass-free dielectric layer that provides mechanical stability without the signal degradation, signal integrity loss, and/or mechanical interference issues associated with a woven glass cloth.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A glass-free pre-impregnated material comprising:
a perforated polybenzimidazole (PBI) sheet; and
a partially cured resin encapsulating the PBI sheet, the partially cured resin further at least partially filling perforations of the PBI sheet.

2. The glass-free pre-impregnated material of claim 1, wherein the perforated PBI sheet includes perforations formed by mechanical drilling, laser drilling, or punching.

3. The glass-free pre-impregnated material of claim 1, wherein the perforated PBI sheet is formed from PBI via injection molding or solution casting.

4. The glass-free pre-impregnated material of claim 1, wherein the perforated PBI sheet corresponds to a PBI sheet having holes that extend from a first surface of the PBI sheet through the PBI sheet to a second surface of the PBI sheet.

5. The glass-free pre-impregnated material of claim 1, wherein the perforated PBI sheet corresponds to a PBI sheet having a first set of perforations that partially extend into the PBI sheet from a first surface of the PBI sheet.

6. The glass-free pre-impregnated material of claim 5, wherein the PBI sheet further includes a second set of perforations that partially extend into the PBI sheet from a second surface of the PBI sheet.

7. The glass-free pre-impregnated material of claim 1, wherein the PBI sheet has a substantially uniform thickness that is in a range between 0.015 mm and 0.03 mm.

8. A process of forming a glass-free pre-impregnated material, the process comprising:
encapsulating a perforated polybenzimidazole (PBI) sheet within a resin;
at least partially filling perforations of the PBI sheet with the resin, and
partially curing the resin to form a-the glass-free pre-impregnated material.

9. The process of claim 8, wherein perforations are formed in the PBI sheet prior to encapsulating the PBI sheet within the resin.

10. The process of claim 9, wherein the perforations include a first set of perforations that partially extend into the PBI sheet from a first surface of the PBI sheet.

11. The process of claim 10, wherein the perforations further include a second set of perforations that partially extend into the PBI sheet from a second surface of the PBI sheet.

12. The process of claim 9, wherein the perforations include holes that extend from a first surface of the PBI sheet through the PBI sheet to a second surface of the PBI sheet.

13. The process of claim 8, wherein the PBI sheet includes a perforated PBI sheet, the process further comprising forming the perforated PBI sheet from polybenzimidazole via injection molding or solution casting.

14. A printed circuit board comprising a glass-free dielectric layer, the glass-free dielectric layer including a perforated polybenzimidazole (PBI) sheet encapsulated within a cured resin,, the partially cured resin further at least partially filling perforations of the PBI sheet.

15. The printed circuit board of claim 14, wherein the perforated PBI sheet includes holes that extend from a first surface of the PBI sheet through the PBI sheet to a second surface of the PBI sheet.

16. The printed circuit board of claim 14, wherein the perforated PBI sheet includes a first set of perforations that partially extend into the PBI sheet from a first surface of the PBI sheet.

17. The printed circuit board of claim 16, wherein the perforated PBI sheet further includes a second set of perforations that partially extend into the PBI sheet from a second surface of the PBI sheet.

18. The printed circuit board of claim 14, wherein the PBI sheet has a substantially uniform thickness that is in a range between 0.015 mm and 0.03 mm.

\* \* \* \* \*